United States Patent [19]

Feldman

[11] Patent Number: 5,391,934
[45] Date of Patent: Feb. 21, 1995

[54] LOAD SENSOR DRIVER APPARATUS

[75] Inventor: Alan S. Feldman, Phoenix, Ariz.

[73] Assignee: Honeywell Inc., Minneapolis, Minn.

[21] Appl. No.: 73,920

[22] Filed: Jun. 8, 1993

[51] Int. Cl.⁶ .............................................. H03K 3/01
[52] U.S. Cl. ...................................... 327/110; 327/73;
                                                327/306; 327/332
[58] Field of Search ................ 307/264, 270, 493, 359

[56] References Cited

U.S. PATENT DOCUMENTS 4,110,605  8/1978  Miller ................................. 364/463
4,490,655 12/1984  Feldman .............................. 318/294

FOREIGN PATENT DOCUMENTS 0066067  5/1979  Japan .................................. 307/270

OTHER PUBLICATIONS

Hal Nelson, "A Sensor System for Aircraft Weight and Balance", Scientific Honeyweller, vol. 8, No. 1, pp. 91–95 (Fall 1987).

*Primary Examiner*—Margaret Rose Wambach
*Attorney, Agent, or Firm*—B. C. Downs; R. E. Champion; A. Medved

[57] ABSTRACT

A driver apparatus for driving one or more electrical loads includes an oscillator for providing an input signal. An amplifier amplifies the input signal. A power transformer has a primary winding for receiving the amplified input signal and at least one secondary winding for providing a drive signal to drive one or more electrical loads. The driver apparatus may include a center tap for the secondary windings or a precision resistive network for providing a pair of diametrically symmetrical drive signals at each secondary winding. A drive signal from one of the secondary windings is compared to a reference signal in an automatic gain control loop for application to the oscillator. An average drive signal could also be derived from one output from each secondary winding to be compared to the reference signal for forming the gain automatic control loop.

28 Claims, 4 Drawing Sheets

LOAD SENSOR DRIVER APPARATUS

FIELD OF THE INVENTION

The present invention relates to the field of electrical load drivers. More particularly, the present invention pertains to a less complex and more efficient means to drive one or more electrical loads.

BACKGROUND OF THE INVENTION

An elaborate compliment of sensors are available for sensing quantities such as altitude, air speed, and weight and balance of objects such as aircraft. One type of sensor for monitoring weight and balance of an aircraft is load sensor 10, FIG. 1. Load sensor 10 is basically a pair of inductors 12, 14 with a movable pole piece 13 between them. Such a load sensor 10 is described in "A Sensor System for Aircraft Weight and Balance," by Hal Nelson, *Scientific Honeyweller*, Fall 1987, pp. 91–95.

As shown in the schematic circuit of the load sensor 10, FIG. 2, when applying diametrically symmetrical sinewaves 21 to inputs 16, 18 of the load sensor 10, a null output at center tap output 19 is produced when the pole piece 13 is centered or balanced. As the pole piece 13 moves towards one of the inductors and away from the other inductor, the change in reluctance causes the output 19 of the load sensor 10 to increase in amplitude proportional to the amount of deflection; in the case of small deflections. The output 19 is in phase with the drive signal applied to the inductor to which the pole piece 13 is deflected towards. This action is analogous to an analytical balance.

In an additional idealized circuit of the load sensor 10 as shown in FIG. 3, each inductor 12, 14 is represented as an inductance and a resistance in series. The two inductors or coils are wired in series and an excitation voltage 23 at a predetermined frequency is applied across them at inputs 16,18. The output signal 24 is measured across inductor 12. In this arrangement, the output signal voltage 24 is proportional to the ratio of the inductor's 12 impedance to the total impedance of both inductors. When the target is in the center position, the coils have equal impedance and so the ratio is 0.5 as shown by the output signal voltage 24 being one half of the excitation voltage 23, FIG. 3. As the pole piece 13 approaches full scale deflection where it comes in contact with one of the inductors, nearly all the excitation voltage 23 is across one of the coils and the voltage ratio approaches 1.0. As shown in FIGS. 2 and 3, the load sensed by load sensor 10 is monitored by monitoring the output signals at outputs 19,24.

In a weight and balance system for an aircraft, in order to generate real time weight and center of gravity information regarding an airplane during loading, various load sensors 10 are attached to the landing gear and when such sensors are electrically energized they provide signals which are analogous to the amount of compression on the landing gear due to the load, which is in turn proportional to the weight thereon. As shown in FIG. 4, a plurality of load sensors N, like load sensor 10, are utilized in such a weight and balance system. When the outputs of these load sensors N are constantly examined by controller and control logic 47 via output multiplexer 46, aircraft weight and center of gravity can quickly be computed. Better loading configurations may then be realized resulting in a safer, better handling aircraft which requires less fuel to complete a given flight.

The weight and balance system 26 includes a driver scheme 28 for driving the load sensors N. As shown in FIG. 4, the output of a 10 Khz square-wave oscillator is filtered to provide a sinewave which drives a primary winding 34 of a small audio transformer 32. The audio transformer includes a secondary winding 36 having a center tap 38. This "phase-splitter" technique produces a pair of diametrically symmetrical sinewaves exactly 180° out-of-phase with each other as shown by the sinewaves 21 of FIG. 2. The peak voltage of one of the sinewaves is compared to a reference voltage and the analog of the difference is fed back to oscillator 30 forming an automatic gain control loop 40. Each sinewave is amplified by amplifiers 41,42 and then applied to a particular load sensor of load sensors N via the drive multiplexer 43. Two feedback multiplexers 44,45 couple the drive outputs back to the respective amplifiers 41,42 in order to assure stability. The load sensor outputs are fed to a demodulator via an output multiplexer 46. A large amount of microprocessor control logic is required to operate the driver scheme 28, and also output multiplexer 46. With this driving scheme of weight and balance system 26, one load sensor is energized and monitored at a time.

A more simplified weight and balance system which measures moment of impact is shown by the sensing system 50 of FIG. 5. A small computer receives the output signals from two sensors 51,52. Because this system is only measuring moment of impact, only two load sensors 51,52 are required to be driven by driver scheme 71; the two sensors being for redundancy. All multiplexers of the weight and balance system 26 are eliminated. However, the always energized load sensors 51,52 require four drive amplifiers 59,60,61,62 instead of the two amplifiers required in the weight and balance system 26. The 10 Khz sinewave from oscillator 53 is applied to the primary winding 55 of the audio transformer 54. The amplifiers receive drive signals from the secondary winding 56 with center tap 57 of the audio transformer 54. Automatic gain control 58 is provided from the secondary winding 56 to the oscillator 53.

As shown in FIG. 4 and FIG. 5, the driver circuitry 28, 71 of both systems 26,50 respectively, include a large quantity of components. The weight and balance system 26 includes multiplexers and two amplifiers and the moment of impact system 50 includes four amplifiers. This inefficient driving scheme wastes energy, uses a large amount of board space and generates excessive heat. Because of these deficiencies, a need exists for a driver apparatus which eliminates excess components and provides a more efficient configuration for driving one or more sensors.

SUMMARY OF THE INVENTION

According to the present invention an efficient driver apparatus of low complexity and component count is provided. The driver apparatus for driving one or more electrical loads includes an oscillation means for providing an input signal. The input signal is amplified by an amplifier. A power transformer having a primary winding receives the amplified input signal and at least one secondary winding of the power transformer provides a drive signal to drive the one or more electrical loads.

In one embodiment of the invention, the apparatus further includes means for providing a pair of diametrically symmetrical drive signals at each secondary winding. This can be accomplished by providing a center tap for each secondary winding which produces a pair of diametrically symmetrical drive signals at each secondary winding or by providing first and second precision resistive elements connected in series across each secondary winding with the series connected resistive elements center tapped therebetween.

In another embodiment, the oscillation means includes gain control means for comparing a drive signal from at least one secondary winding to a reference signal resulting in a gain control signal for application to an oscillator of the oscillation means. When there are at least two secondary windings with each secondary winding providing drive signals, the gain control means may include means for averaging a drive signal from each of the secondary windings to form an average drive signal for comparison with the reference signal.

In another embodiment, the driver apparatus drives one or more load sensors. Each load sensor has a pair of inductors with a moveable pole piece therebetween. The pair of inductors is connected in series with a center tapped output therebetween and an input on each end of the series connected pair such that a null output signal is generated at the center tapped output when diametrically symmetrical drive signals are applied to the respective inputs of the series connected pair of inductors and the pole piece is centered between the pair of inductors. The apparatus of this embodiment may further include means for generating a pair of diametrically symmetrical drive signals at the outputs of at least one secondary winding for application to the inputs of the one or more load sensors. The movement of the pole piece between the pair of the inductors can be detected by monitoring the center tapped output of the load sensor.

DESCRIPTION OF THE PREFERRED EMBODIMENTS

Figure 6:
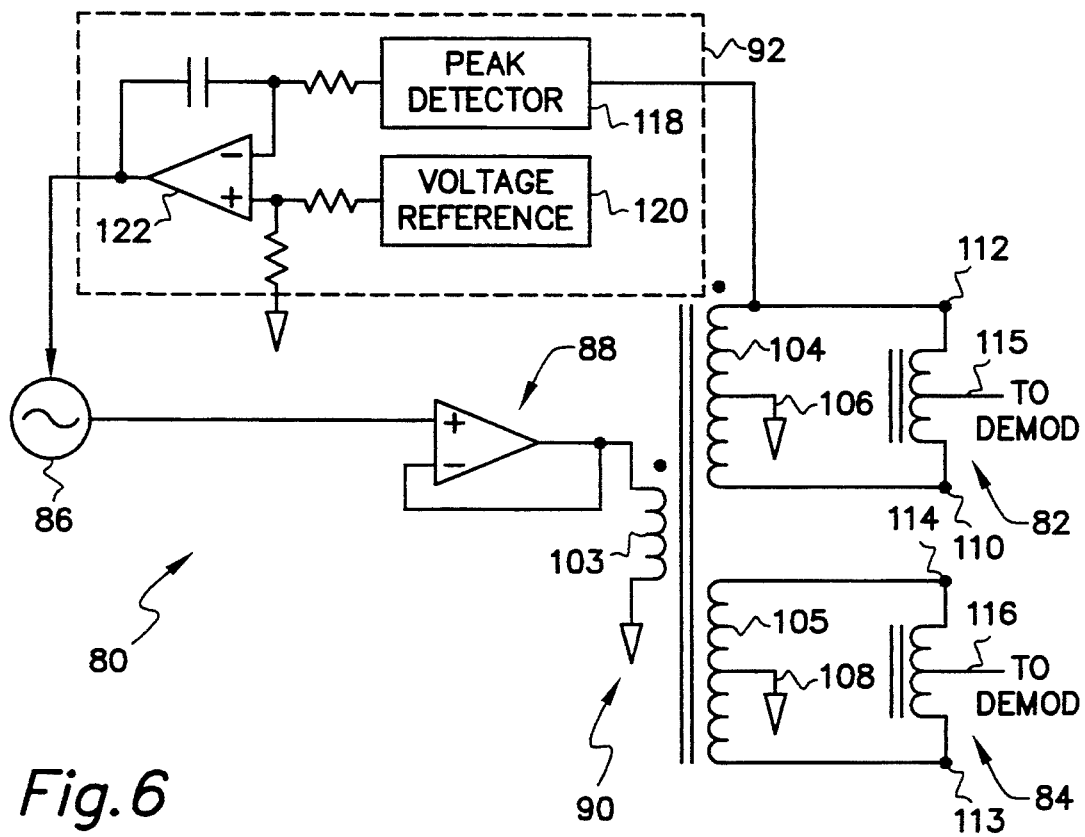
FIG. 6 is a block diagram of a driver apparatus in accordance with the present invention driving load sensors such as the load sensor shown in FIG. 1.
Figure 7:
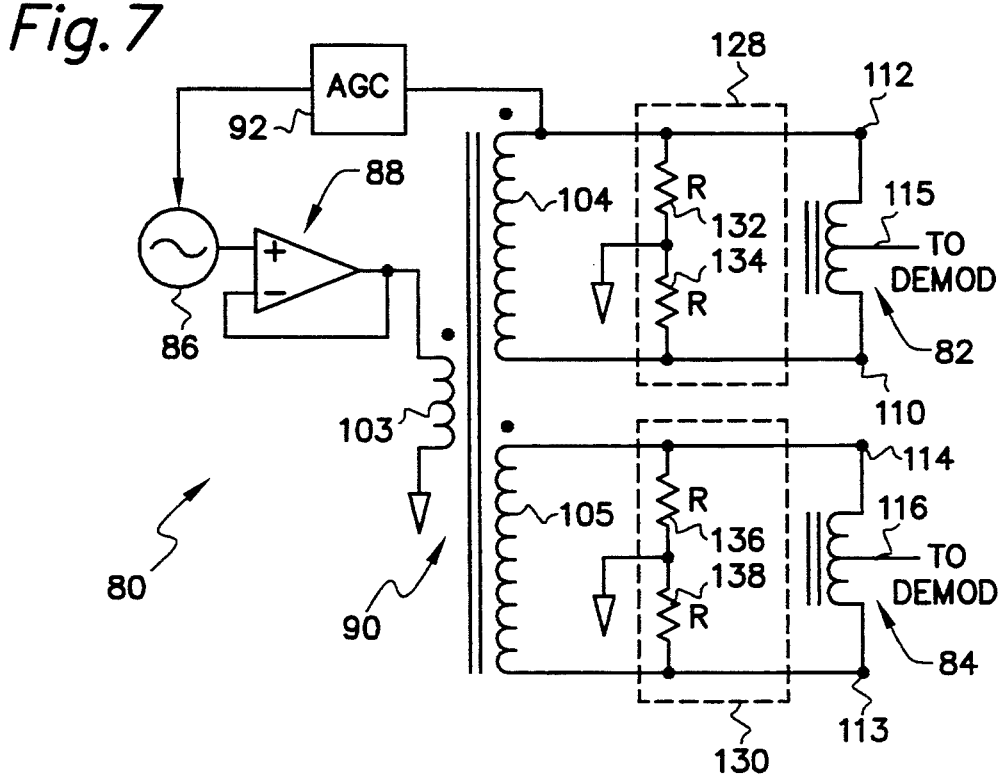
FIG. 7 is a block diagram of an alternative of a driver apparatus in accordance with the present invention driving load sensors such as the load sensor shown in FIG. 1.
Figure 8:
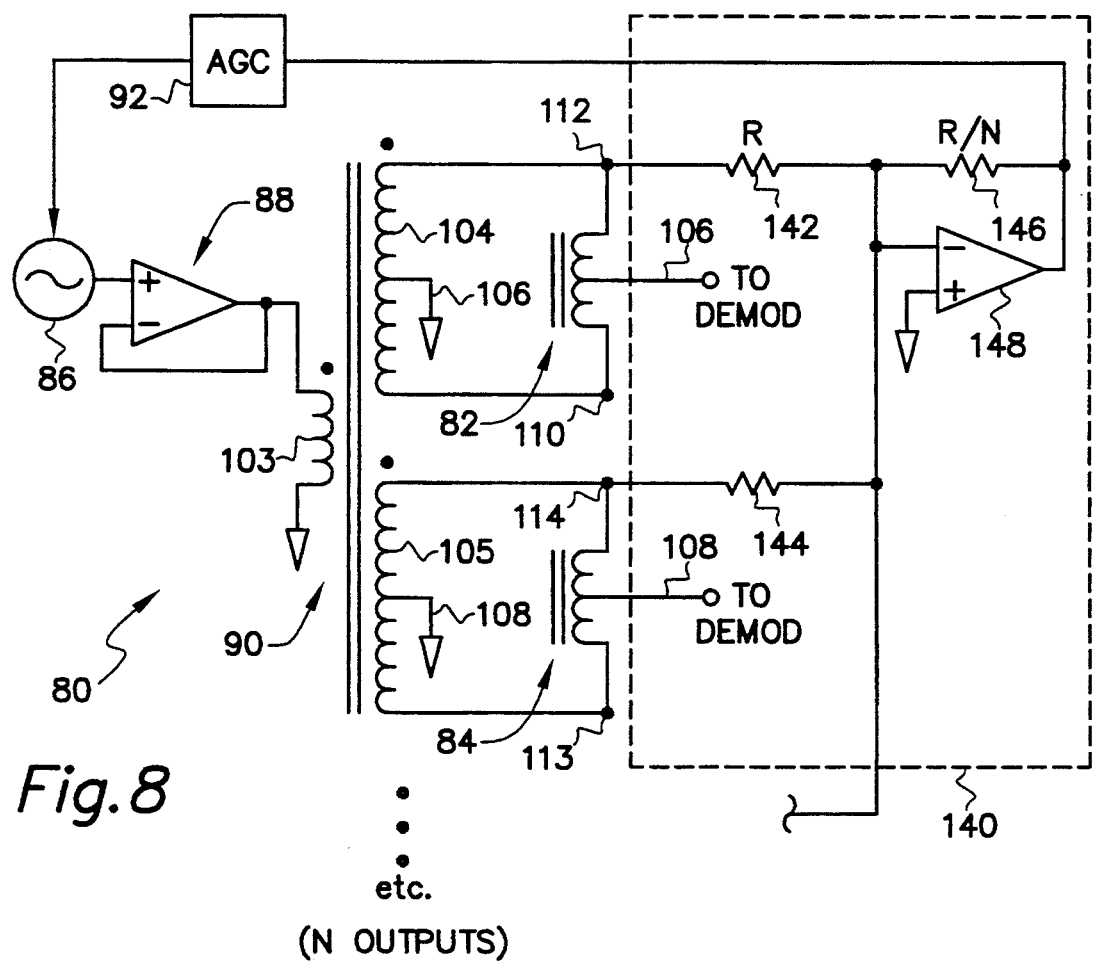
FIG. 8 is an alternative embodiment of the driver apparatus as shown in FIG. 6 utilizing an output averaging enhancement.

With reference to FIGS. 6–8, a driver apparatus 80 in accordance with the present invention shall be described. FIG. 6 shows a driver apparatus 80 for driving two load sensors 82,84. The load sensors 82,84 are load sensors such as the load sensor described in the Background of the Invention section herein with respect to FIG. 1. Load sensor 82 includes inputs 110,112 and center tapped output 115. Load sensor 84 includes inputs 113,114 and center tapped output 116.

The driver apparatus 80 includes oscillator 86, amplifier 88, power transformer 90 and automatic gain control circuit 92 for forming an automatic gain control loop. Oscillator 86 includes a 10 Khz squarewave oscillator which is filtered to provide a sinewave for input to the non-inverting input of amplifier 88. Amplifier 88 is a buffer amplifier with a gain of one. One skilled in the art will recognize that a particular amount of gain may be necessary for driving different electrical loads and that the amplifier could have a gain network associated therewith. In addition, if the amplifier includes a gain to make the amplifier more stable, the power transformer could be utilized to provide an inverse to bring the loop back to a gain of one. The amplified input of the amplifier 88 is applied to a primary winding 103 of power transformer 90.

Figure 1:
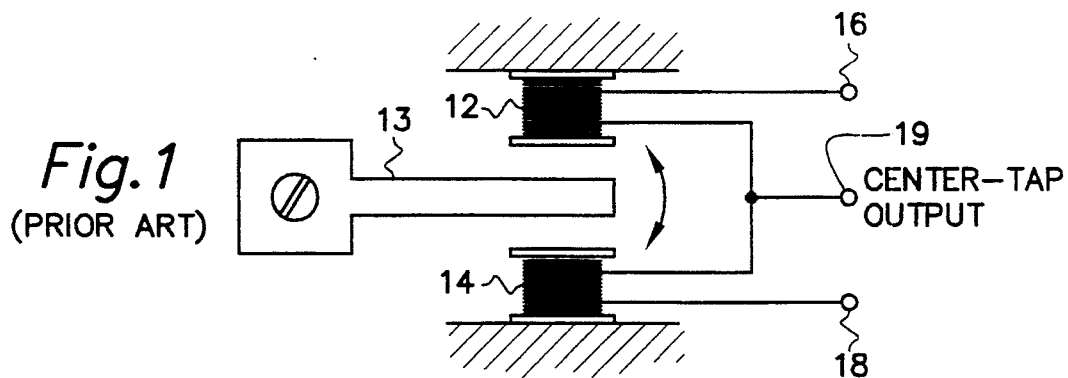
FIG. 1 is a prior art load sensor to be driven by the driver apparatus in accordance with the present invention.
Figure 2:
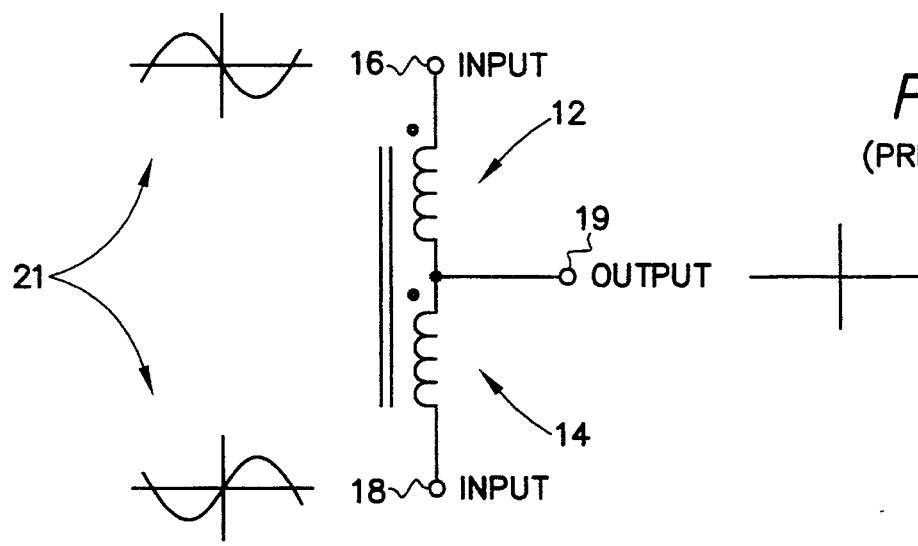
FIG. 2 is a prior art schematic representation of the load sensor shown in FIG. 1 with diametrically symmetrical drive signals applied thereto.

Power transformer 90 includes the primary winding 103, and two secondary windings 104,105. One skilled in the art will recognize that any number of secondary windings can be utilized to drive respectively connected load sensors. Each of the secondary windings 104,105 has a center tap 106,108, respectively, to produce a pair of diametrically symmetrical sinewaves exactly 180° out-of-phase with each other. The pair of diametrically symmetrical sinewaves output from secondary winding 104 are applied to the inputs 110,112 of load sensor 82 and the pair of diametrically symmetrical sinewaves of secondary winding 105 are applied to the inputs 113,114 of load sensor 84. As described with respect to FIG. 2 in the Background of the Invention section herein, by applying diametrically symmetrical sinewaves to the inputs of the load sensors 82,84 a null output is produced when the pole piece 13, FIG. 1, is centered or balanced; the null output appearing at center tap output 115 of load sensor 82 and center tapped output 116 of load sensor 84.

The peak voltage of one of the diametrically symmetrical sinewaves is utilized in the automatic gain control circuit 92. A peak detector 118 detects the peak of one of the diametrically symmetrical sinewaves and the peak voltage is compared to a percentage of the output of voltage reference 120 by comparator 122. The analog of the difference between the percentage output of voltage reference 120 and the peak voltage as detected by peak detector 118 is integrated with the feedback loop of the comparator 122 to control the amplitude of the oscillator 86 forming the automatic gain control loop. Voltage reference 120 is an LH0070, 10 Volt reference device divided down to 4.95 volts to provide the proper desired RMS peak voltage.

In the present invention, a power transformer with one amplifier on the primary side replaces the audio transformer as utilized with the four amplifiers or as utilized with the two amplifiers and multiplexer arrangement on the secondary side; discussed in the Background of the Invention section. The amplifier utilized may be a low power device with a higher input voltage being utilized and lower input current being employed. Thus, smaller i²r losses will be incurred. In addition, a lower component count is realized. This reduces the need of board space, makes the circuit less complex, lowers the cost, and increases the reliability of the driver apparatus. Overall, with the above being accomplished, the driver apparatus is more efficient.

As indicated in FIG. 7, the driver apparatus 80 as shown in FIG. 6 can be improved by optimizing the diametrically symmetrical output waveform symmetry by eliminating the center tap 106, 108 of the power transformer secondary windings 104, 105 and employing resistive centering networks 128, 130. Resistor network 128 includes two precision type resistors 132, 134 connected in series across the secondary winding 104 with a center tap therebetween. Resistor network 130 includes two precision type resistors 136, 138 connected in series across secondary winding 105 with a center tap therebetween. These center tapped precision resistor networks 128,130 provide for the diametrically symmetrical sinewaves 21 for input to load sensors 82,84, as described previously with regard to FIG. 2.

Figure 4:
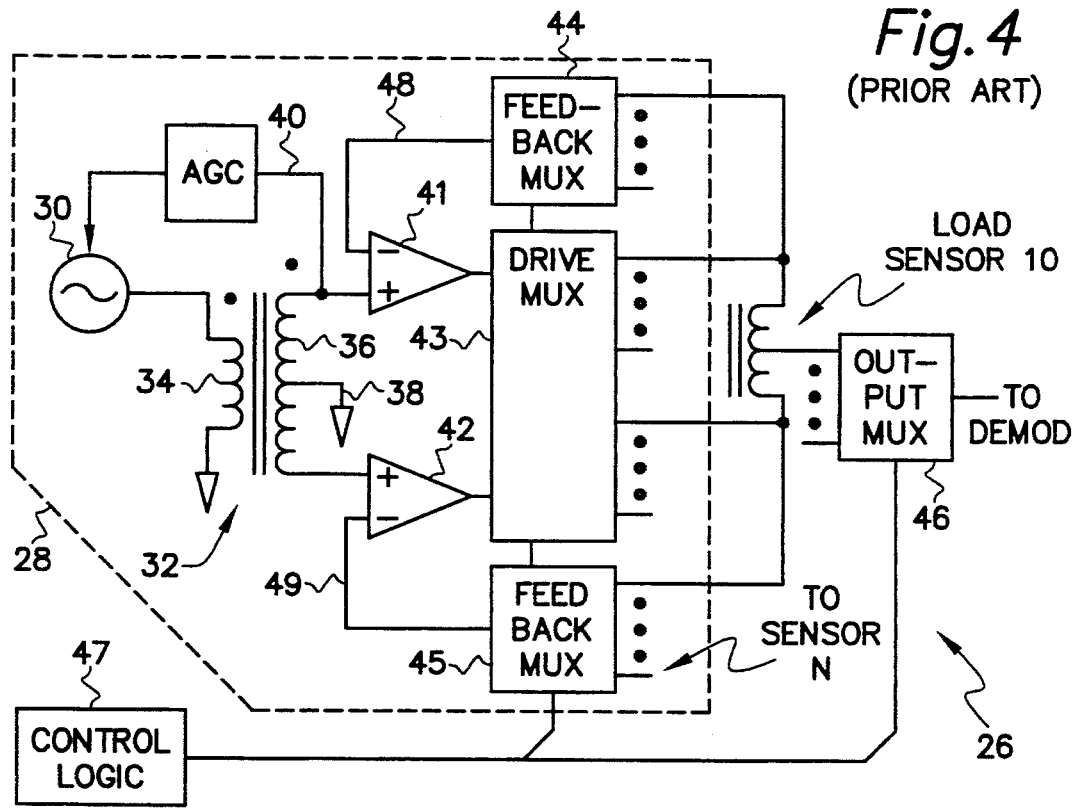
FIG. 4 is a prior art block diagram of a weight and balance system utilizing load sensors such as the load sensor shown in FIG. 1.
Figure 5:
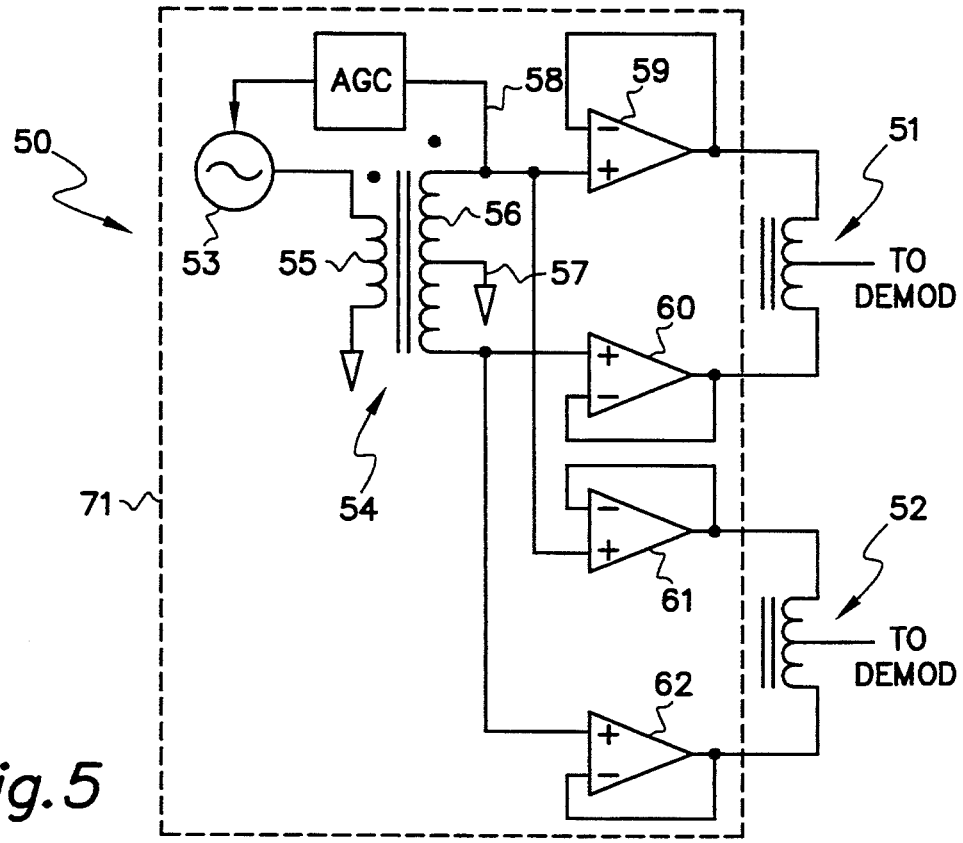
FIG. 5 is a prior art block diagram of a moment of impact sensing system utilizing two load sensors such as the load sensor of FIG. 1.

Further improvement of the driver apparatus 80 as shown in FIG. 6 can be achieved by utilizing the averaging circuitry 140, FIG. 8. Although this enhancement requires additional components, when utilized in a system such as shown in FIG. 4 where the power and feedback multiplexers are eliminated, a significant channel-to-channel integrity is accomplished. The averaging circuitry 140 includes resistors 142 and 144 of equal value. Each resistor 142,144 is connected to one input of each load sensor 82,84 and thus one side of each secondary winding to provide input of signals therefrom to amplifier 148, i.e. in FIG. 8 connected at input 112 and input 114. Resistor 146, having a value equal to that of resistor 142 or resistor 144 divided by the number of outputs corresponding to the number of secondary windings, forces an average output signal at the output operational amplifier 148 equal to the sum of the drive signal at the inputs of the secondary windings divided by the number of windings. As such, the peak of the average output signal is detected by peak detector 118 which in turn is compared to a percentage of the output of voltage reference 120 utilizing comparator 122 and the analog difference of the comparison is used to control the amplitude of oscillator 86.

Figure 3:
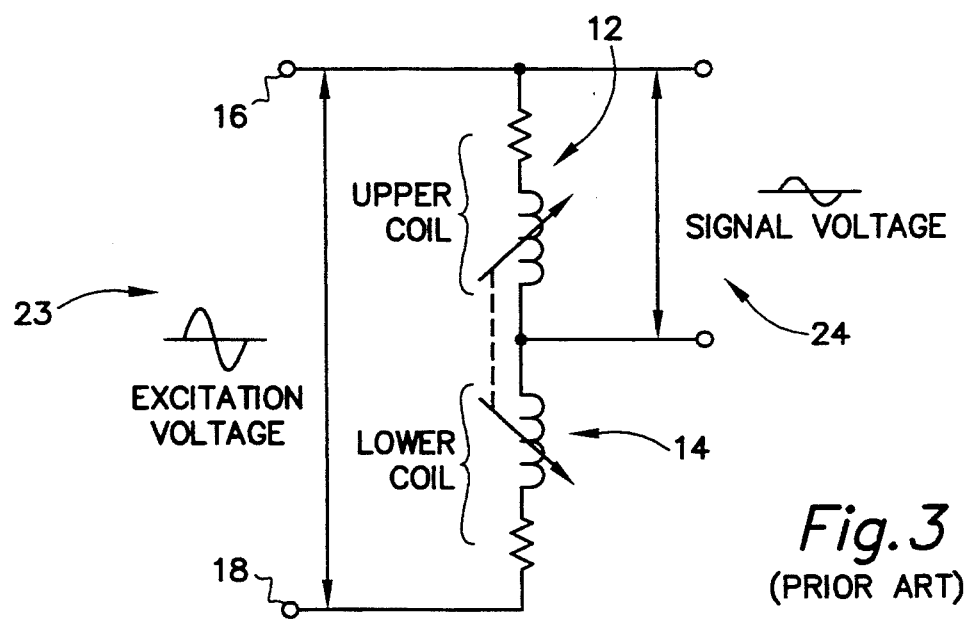
FIG. 3 is a schematic representation of the load sensor shown in FIG. 1 with an excitation voltage applied across the sensor.

It should be readily apparent that the center taps of the secondary windings or the precision resistor network for the embodiments described above may be eliminated such that the voltage from the secondary winding is applied across the load sensors 82,84, respectively. As described in the Background of the Invention section herein with regard to FIG. 3, a balanced pole piece 13 with an excitation voltage 23 applied across the inputs of the load sensor would produce a signal voltage output at the center tapped output of the load sensor equal to one half of the excitation voltage. The output would then be monitored and interpreted differently by a controller and controller logic to judge movement of the pole piece 13 than when diametrically symmetrical sinewaves are utilized.

Figure 9:
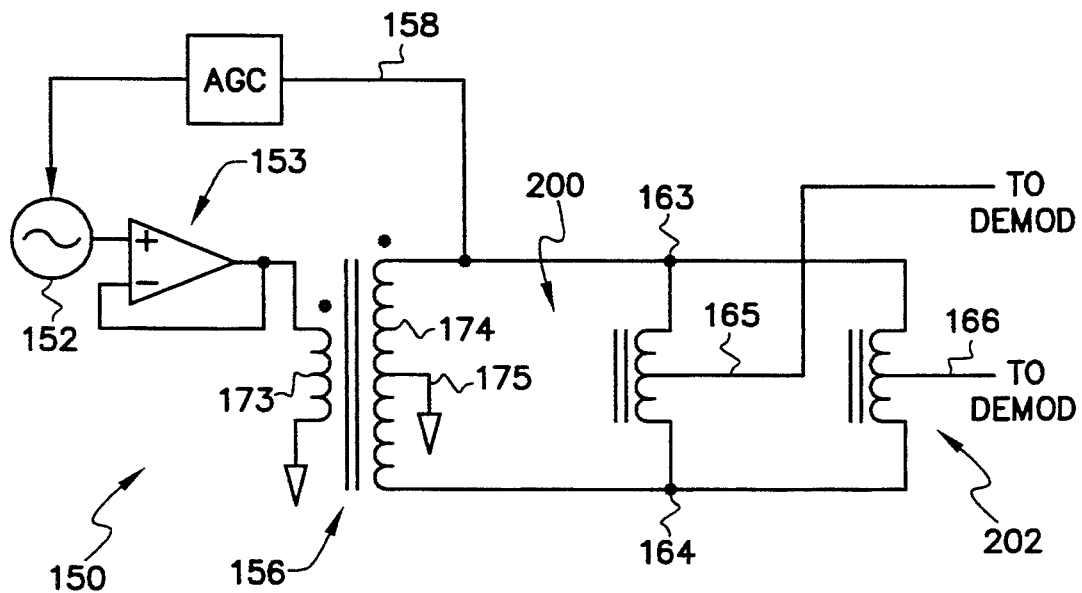
FIG. 9 is an additional alternative embodiment of a driver apparatus for driving load sensors such as the load sensor shown in FIG. 1.

An alternative embodiment, FIG. 9 shows a load sensor driver apparatus 150 for driving load sensors 200,202 which are connected in parallel across the secondary winding 174 having a center tap 175 for providing diametrically symmetrical sinewaves to the inputs 163,164 of both the parallel connected load sensors 200,202. This configuration provides for a driver apparatus having even a lesser quantity of components than previously described. Oscillator 152 provides a sinewave input to amplifier 153 which applies the amplified signal to a primary winding 173 of power transformer 156. One secondary winding 174 of the power transformer 156 provides the same drive signal for both load sensors 200,202. Automatic gain control loop 158 is accomplished in the same manner as previously described.

It should be readily apparent to one skilled in the art that the driver apparatus shown in the embodiments of FIGS. 6,7 and 8 drive the load sensors simultaneously with the load sensors continually being energized. This is in direct contrast to energizing and monitoring one load sensor at a time as shown in the prior art of FIG. 4.

Those skilled in the art will recognize that only preferred embodiments of the present invention have been disclosed herein, that other advantages may be found and realized, and that various modifications may be suggested by those versed in the art. It should be understood that the embodiments shown herein may be altered and modified without departing from the true spirit and scope of the invention as defined in the accompanying claims.

What is claimed is:

1. A driver apparatus for driving one or more electrical loads, comprising:
   oscillating means for providing an input signal;
   an amplifier for amplifying said input signal;
   a power transformer having:
   a) a primary winding for receiving said amplified input signal and
   b) at least one secondary winding for providing a drive signal to drive said one or more electrical loads, each of said secondary windings including a center tap to produce a pair of diametrically symmetrical drive signals.

2. An apparatus according to claim 1, wherein at least two electrical loads are connected in parallel across one secondary winding.

3. An apparatus according to claim 2, wherein said apparatus further includes means for providing a pair of diametrically symmetrical drive signals at said one secondary winding.

4. An apparatus according to claim 1, wherein said oscillation means includes gain control means for comparing said drive signal from said at least one secondary winding to a reference signal resulting in a gain control signal for application to an oscillator of said oscillation means.

5. An apparatus according to claim 4, wherein said apparatus includes at least two secondary windings, each secondary winding providing a drive signal, and wherein said gain control means includes means for averaging said drive signals from said each secondary windings to form an average drive signal for comparison with said reference signal.

6. An apparatus according to claim 1, wherein said apparatus includes at least two secondary windings, each secondary winding for driving an electrical load, and further wherein said oscillation means includes gain control means for comparing one of said diametrically symmetrical drive signals from one of said secondary windings to a reference signal resulting in a gain control signal for application to an oscillator of said oscillation means.

7. An apparatus according to claim 1, wherein said apparatus includes at least two secondary windings, each secondary winding for driving an electrical load, and further wherein said oscillation means includes means for averaging said drive signals from said secondary windings to form an average drive signal and gain control means for comparing said average drive signal to a reference signal resulting in a gain control signal for application to an oscillator of said oscillation means.

8. An apparatus according to claim 3, wherein said oscillation means includes gain control means for comparing one of said diametrically symmetrical drive signals with a reference signal to form a gain control signal for application to an oscillator of said oscillation means.

9. A driver apparatus for driving one or more load sensors, each load sensor including a pair of inductors with a moveable pole piece therebetween, said pair of inductors connected in series with a center tapped output therebetween and an input on each end of the series connected pair such that a null output signal is generated at said center tapped output when diametrically symmetrical drive signals are applied to the respective inputs of said series connected pair of inductors and the pole piece is centered between the pair of inductors, said driver apparatus comprising:

oscillation means for providing an input signal;
an amplifier for amplifying said input signal;
a power transformer having a primary winding for receiving said amplified input signal and at least one secondary winding for driving said one or more load sensors.

10. An apparatus according to claim 9, further including means for generating a pair of diametrically symmetrical drive signals at each of said at least one secondary windings for application to the inputs of the one or more load sensors, whereby movement of the pole piece between the pair of inductors can be detected by monitoring the center tapped output of the load sensor.

11. An apparatus according to claim 10 wherein said oscillation means includes gain control means for comparing one of said drive signal from said at least one secondary winding to a reference signal resulting in a gain control signal for application to an oscillator of said oscillation means.

12. An apparatus according to claim 10 wherein said generation means includes a center tap for each secondary winding to produce said pair of diametrically symmetrical drive signals for application to the inputs of the load sensor.

13. An apparatus according to claim 10, wherein said generation means includes first and second precision resistive elements connected in series across each of said at least one secondary winding, said series connected resistive elements center tapped therebetween to produce a pair of diametrically symmetric drive signals for driving the inputs of the load sensor.

14. An apparatus according to claim 11, wherein said apparatus includes at least two secondary windings and said oscillation means further includes means for averaging one of said pair of drive signals from each secondary winding to form an average drive signal for comparison with said reference signal.

15. An apparatus according to claim 10, wherein at least two load sensors are connected in parallel across one secondary winding.

16. A driver circuit for driving one or more electrical loads, comprising:
oscillating means for providing an input signal;
an amplifier for amplifying said input signal;
a power transformer having:
 a) a primary winding for receiving said amplified input signal and
 b) at least one secondary winding for providing a drive signal to drive said one or more electrical loads; and,
a first and second precision resistive elements connected in series across said secondary winding, said series connected resistive elements center tapped therebetween to provide said pair of diametrically symmetrical drive signals.

17. The driver circuit according to claim 16, wherein at least two electrical loads are connected in parallel across one secondary winding.

18. The driver circuit according to claim 17, wherein said apparatus further includes means for providing a pair of diametrically symmetrical drive signals at said one secondary winding.

19. The driver circuit according to claim 18, wherein said oscillation means includes gain control means for comparing one of said diametrically symmetrical drive signals with a reference signal to form a gain control signal for application to an oscillator of said oscillation means.

20. The driver circuit according to claim 16, wherein said oscillation means includes gain control means for comparing said drive signal from said at least one secondary winding to a reference signal resulting in a gain control signal for application to an oscillator of said oscillation means.

21. The driver circuit according to claim 17, wherein said circuit includes at least two secondary windings, each secondary winding providing a drive signal, and wherein said gain control means includes means for averaging said drive signals from said each secondary windings to form an average drive signal for comparison with said reference signal.

22. An electrical load driving circuit for driving one or more load sensors, each load sensor including a pair of inductors with a movable pole piece therebetween, said pair of inductors connected in series with a center tapped output therebetween and an input on each end of the series connected pair such that an output signal is generated at said center tapped output when drive signals are applied to the respective inputs of said series connected pair of inductors, said output signal representative of the position of said moveable pole piece relative to said pair of inductors, said driving circuit comprising:

oscillation means for providing an input signal;
an amplifier for amplifying said input signal;
a power transformer having a primary winding for receiving said input signal and at least one secondary winding for driving said one or more load sensors; and,
means for generating a pair of diametrically symmetrical drive signals at each of said at least one secondary windings for application to the inputs of the one or more load sensors, whereby movement of the pole piece between the pair of inductors can be detected by monitoring the center tapped output of the load sensor.

23. The electrical load driving circuit according to claim 22, wherein said generation means includes a centertap for each secondary winding to produce said pair of diametrically symmetrical drive signals for application to the inputs of the load sensor.

24. The electrical load driving circuit according to claim 22, wherein said generation means includes first and second precision resistive elements connected in series across each of said at least one secondary winding, said series connected resistive elements center tapped therebetween to produce a pair of diametrically symmetric drive signals for driving the inputs of the load sensor.

25. The electrical load driving circuit according to claim 22, wherein at least two load sensors are connected in parallel across one secondary winding.

26. An electrical load driving circuit for driving one or more load sensors, each load sensor including a pair of inductors with a movable pole piece therebetween, said pair of inductors connected in series with a center tapped output therebetween and an input on each end of the series connected pair such that an output signal is generated at said center tapped output when drive signals are applied to the respective inputs of said series connected pair of inductors, said output signal representative of the position of said moveable pole piece relative to said pair of inductors, said driving circuit comprising:

oscillation means for providing an input signal;
  a power transformer having a primary winding for receiving said input signal and at least one secondary winding for driving said one or more load sensors; and,
  gain control means for comparing one of said drive signals from said at least one secondary winding to a reference signal resulting in a gain control signal for application to an oscillator of said oscillation means.

27. The electrical load driving circuit according to claim 26, wherein said circuit includes at least two secondary windings and said oscillation means further includes means for averaging one of said pair of drive signals from each secondary winding to form an average drive signal for comparison with said reference signal.

28. A circuit for driving multiple load sensors, each load sensor including a pair of inductors with a movable pole piece therebetween, said pair of inductors connected in series with a center tapped output therebetween and an input on each end of the series connected pair such that an output signal is generated at said center tapped output when drive signals are applied to the respective inputs of said series connected pair of inductors, said output signal representative of the position of said moveable pole piece relative to said pair of inductors, said driving circuit comprising:

oscillation means for providing an input signal;
  an amplifier for amplifying said input signal; and,
  a power transformer having a primary winding for receiving said input signal and having a plurality of secondary windings, each of said secondary windings driving one of said multiple load sensors.

* * * * *